(12) United States Patent
Swelm et al.

(10) Patent No.: US 10,770,605 B2
(45) Date of Patent: Sep. 8, 2020

(54) PHOTODIODE WITH SPINEL OXIDE PHOTOACTIVE LAYER

(71) Applicant: King Abdulaziz University, Jeddah (SA)

(72) Inventors: Wageh Swelm, Jeddah (SA); Fahrettin Yakuphanoglu, Jeddah (SA); Ahmed A. Al-Ghamdi, Jeddah (SA); Yusuf Abdulaziz Al-Turki, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 15/492,267

(22) Filed: Apr. 20, 2017

(65) Prior Publication Data

US 2018/0308998 A1    Oct. 25, 2018

(51) Int. Cl.
*H01L 31/00* (2006.01)
*H01L 31/0352* (2006.01)
(Continued)

(52) U.S. Cl.
CPC ........ *H01L 31/035218* (2013.01); *G01J 1/42* (2013.01); *G01J 5/0853* (2013.01); *G01J 5/28* (2013.01); *H01L 31/0296* (2013.01); *H01L 31/022408* (2013.01); *H01L 31/022425* (2013.01); *H01L 31/0336* (2013.01);
(Continued)

(58) Field of Classification Search
CPC ..... H01L 31/035218; H01L 31/022408; H01L 31/022425; H01L 31/0296; H01L 31/0336; H01L 31/035227; H01L 31/072; H01L 31/109; H01L 31/18; G01J 1/42;
(Continued)

(56) References Cited

U.S. PATENT DOCUMENTS 4,254,429 A * 3/1981 Yamazaki ........... H01L 29/1604
136/258
4,463,216 A * 7/1984 Nakano ............. H01L 31/02168
136/256
(Continued)

FOREIGN PATENT DOCUMENTS

WO    WO 2012/163426    * 12/2012

OTHER PUBLICATIONS

Dillert et al., Research Update: Photoelectrochemical water splitting and photocatalytic hydrogen production using ferrites (MFe2O4) under visible light irradiation, Apl Materials 3, 104001, Sep. 25, 2015, pp. 1-15. (Year: 2015).*

(Continued)

*Primary Examiner* — Thanh Truc Trinh
(74) *Attorney, Agent, or Firm* — Oblon, McClelland, Maier & Neustadt, L.L.P.

(57) ABSTRACT

A photodiode comprising a photoactive spinel oxide layer is described. This photoactive spinel oxide layer forms a contact with both a light absorption layer of quantum dots, quantum wires, or quantum rods, and an inorganic substrate layer. In some embodiments, the inorganic substrate layer and the photoactive spinel oxide layer form an isotype junction. Methods of characterizing the photodiode are provided and demonstrate commercially relevant electrical and optoelectronic properties, particularly the ability to operate as a photodetector with a high photosensitivity. An economical process for preparing the photodiode is provided as well as applications.

16 Claims, 7 Drawing Sheets

(51) Int. Cl.
  *H01L 31/0224* (2006.01)
  *H01L 31/072* (2012.01)
  *H01L 31/0336* (2006.01)
  *H01L 31/18* (2006.01)
  *G01J 1/42* (2006.01)
  *G01J 5/28* (2006.01)
  *H01L 31/0296* (2006.01)
  *H01L 31/109* (2006.01)
  *G01J 5/08* (2006.01)

(52) U.S. Cl.
  CPC .... *H01L 31/035227* (2013.01); *H01L 31/072* (2013.01); *H01L 31/109* (2013.01); *H01L 31/18* (2013.01); *G01J 2001/4266* (2013.01); *Y02E 10/50* (2013.01)

(58) Field of Classification Search
  CPC .... G01J 5/0853; G01J 5/28; G01J 2001/4266; Y02E 10/50
  USPC .................................. 136/243–293
  See application file for complete search history.

(56) References Cited

U.S. PATENT DOCUMENTS

| | | | |
|---|---|---|---|
| 4,579,594 A * | 4/1986 | Nanao | C01B 13/32 |
| | | | 106/287.17 |
| 4,681,637 A * | 7/1987 | Rademachers | C01G 49/0063 |
| | | | 106/425 |
| 7,791,157 B2 * | 9/2010 | Cho | B82Y 10/00 |
| | | | 257/436 |
| 8,138,567 B2 | 3/2012 | Ivanov et al. | |
| 2007/0120059 A1 | 5/2007 | Tailhades et al. | |
| 2009/0065053 A1 * | 3/2009 | Gulbinski | H01L 31/022425 |
| | | | 136/256 |
| 2012/0156827 A1 | 6/2012 | Michael et al. | |
| 2013/0125987 A1 * | 5/2013 | Kawasaki | H01G 9/2059 |
| | | | 136/263 |

OTHER PUBLICATIONS

A Alyamani et al., "Photoresponse and photocapacitor properties of AU/AZO/p-Si/Al diode with AZO film prepared by pulsed laser deposition (PLD) method," Applied Physics A, Apr. 2016, vol. 122, No. 297.

A. Tataroglu et al., "A new aluminum iron oxide Schottky photodiode designed via sol-gel coating method," Chinese Physics B, 2014, vol. 23.

M. Cavas et al., "Photoresponse and electrical properties of Al/nanostructure $NiFe_2O_4$/p-Si/Al photodiode," Journal of Electroceramics, 2014, vol. 32, pp. 163-168.

* cited by examiner

PHOTODIODE WITH SPINEL OXIDE PHOTOACTIVE LAYER

BACKGROUND OF THE INVENTION

Technical Field

The present invention relates to a photodiode comprising a spinel oxide layered between a light absorption layer and an inorganic semiconductor.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Optoelectronic devices generate electric current from electromagnetic radiation. For example, optoelectronic devices can convert solar light into electric current. Optoelectronic devices may include photosensitive devices. Optoelectronic devices may also generate electric current from other various light sources. Another type of optoelectronic device is a photodiode, which may detect an electric signal caused by sunlight absorption. In operation, a photodiode with a heterojunction structure is used to detect the electric current, or photocurrent. Photodiodes may be further characterized by their rectifying properties under different externally applied voltages and light intensities. Conventional optoelectronic devices may be manufactured from inorganic semiconductors such as silicon, gallium arsenide, indium phosphide and others, which also function as the photoactive layer. The photoactive layer may be chosen for certain absorption properties to effectively generate electric current via different types of electromagnetic radiation.

A functional material is described below for the photoactive layer in a photodiode. A photodiode includes a photoactive layer, metal electrodes, and an encapsulation. The photoactive layer absorbs the light and converts the light energy to current or voltage.

The light can be absorbed when the light energy is greater than the band gap value of the semiconductor and an exciton is formed. In this light absorbing process, a charge separation occurs and photoconductive and photovoltaic effects take place in the photodiode.

Photodiodes are typically formed by various combinations of semiconductors such as p-type (hole conducting) semiconductors or n-type (free electron conducting) semiconductors. When two n-type semiconductors or two p-type semiconductors are used in the same device to form a p-p junction or an n-n junction, this device is known as an isotype photodiode. There is a need for such isotype photodiodes, especially with high performance parameters, low material costs, and reliable fabrication methods. There is also need for a photodiode that can be adjusted to different solar light sensitivities.

In view of the foregoing, one objective of the present invention is to provide a photodiode comprising a photoactive spinel oxide layered between a light absorption layer and an inorganic semiconductor. In one aspect of the invention the photodiode further comprises an isotype junction.

BRIEF SUMMARY OF THE INVENTION

According to a first aspect, the present disclosure relates to a photodiode comprising an ohmic contact having a first work function, an inorganic substrate layer in continuous contact with the ohmic contact, a photoactive layer in continuous contact with the inorganic substrate layer, a light absorption layer in continuous contact with the photoactive layer, and a top electrode in contact with the light absorption layer, where the top electrode has a second work function. The inorganic substrate layer of the photodiode comprises a semiconductor. The photoactive layer comprises a spinel metal oxide of a general formula $A^{2+}(B^{3+})_2(O^{2-})_4$ where A and B are metal ions. The light absorption layer of the photodiode comprises at least one material selected from the group consisting of quantum dots, quantum rods, and quantum wires. Also, the second work function of the top electrode is greater than the first work function of the ohmic contact.

In one embodiment of the photodiode, the light absorption layer comprises quantum dots of at least one material selected from the group consisting of lead sulfide (PbS), lead selenide (PbSe), lead telluride (PbTe), cadmium selenide (CdSe), cadmium sulfide (CdS), and cadmium telluride (CdTe).

In one embodiment of the photodiode, the metal ion A is at least one selected from the group consisting of Zn, Cu, Co, Mn, Ni, Mg, Be, and Ti, and the metal ion B is at least one selected from the group consisting of Al, Fe, Cr, and V.

In one embodiment of the photodiode, the photoactive layer comprises a spinel metal oxide selected from the group consisting of $ZnFe_2O_4$, $CuFe_2O_4$, $CoFe_2O_4$, $MnFe_2O_4$, and $NiFe_2O_4$.

In one embodiment of the photodiode, the spinel metal oxide has a direct optical band gap of 2.0-3.0 eV.

In one embodiment of the photodiode, the semiconductor of the inorganic substrate layer comprises at least one selected from the group consisting of silicon, germanium, indium gallium arsenide, lead (II) sulfide, indium phosphor, and mercury cadmium telluride.

In one embodiment of the photodiode, the semiconductor of the inorganic substrate layer is a p-type silicon based semiconductor.

In one embodiment of the photodiode, the optical band gap of the photoactive layer is greater than the optical band gap of the light absorption layer.

In one embodiment of the photodiode, the inorganic substrate layer has a thickness of 200-600 μm.

In one embodiment of the photodiode, the photoactive layer has a thickness of 20-250 nm.

In one embodiment of the photodiode, the light absorption layer has a thickness of 10-100 nm.

In one embodiment of the photodiode, the inorganic substrate layer and the photoactive layer form an isotype junction.

In one embodiment of the photodiode, the top electrode is aluminum.

In one embodiment of the photodiode, the inorganic substrate layer has a resistivity of 1-10 Ω·cm.

In one embodiment, the photodiode has a barrier height of 0.5-1.25 eV.

In one embodiment, the photodiode has a photoresponsivity of 0.10-0.40 A/W.

In one embodiment, the photodiode has a photosensitivity defined as the ratio of illuminated current to dark current of 6000-7500 at a bias of 5.0-8.0 V.

According to a second aspect, the present disclosure relates to a method for forming the photodiode of the first aspect. These steps involve depositing the ohmic contact onto the inorganic substrate layer; spin or drop coating the spinel metal oxide onto the inorganic substrate layer, to form the photoactive layer; spin or drop coating quantum dots, quantum rods, or quantum wires onto the photoactive layer, thereby forming the light absorption layer; and depositing the top electrode onto the light absorption layer.

According to a third aspect, the present disclosure relates to a method of generating an electronic current using the photodiode of the first aspect. This method involves irradiating the photodiode of the first aspect with a light source having a wavelength of 150-1500 nm.

According to a fourth aspect, the present disclosure relates to an electronic device comprising the photodiode of the first aspect.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

The present disclosure will be better understood with reference to the following definitions. As used herein, the words "a" and "an" and the like carry the meaning of "one or more." Within the description of this disclosure, where a numerical limit or range is stated, the endpoints are included unless stated otherwise. Also, all values and subranges within a numerical limit or range are specifically included as if explicitly written out.

As used herein, "electric current" refers to a rate of flow of electric charge. Loosely-bound electrons are considered as free electrons, capable of moving throughout the material, and considered the negative charge carriers. An electron hole is the absence of an electron from a valence band and allows conceptualization of interactions between electrons and a nearly full system. The electron holes are the positive charge carriers in materials missing a valence electron, for example, certain semiconductor crystals.

As used herein, the term "transparent" refers to a property of a material that allows an average transmission of at least 80% of an incident electromagnetic radiation having a wavelength in a range from about 150 nm to about 1500 nm.

In classical semiconductors, electrons may have energies only within certain ranges of energy levels, termed bands. These bands are located energetically between the ground state energy (the energy of electrons tightly bound to the atomic nuclei of the material) and the free electron energy (the energy required for an electron to escape entirely from the material). The majority of low energy states, close to the nucleus, are occupied by electrons up to a particular band energy level called the valence band. In metals and conductors, the valence band is typically filled with electrons, so extra electrons occupy a conduction band, which is an energy level immediately above the valence band. Semiconductors and insulators, in contrast, have very few (semiconductor) or virtually none (insulator) of their electrons available in the conduction band.

The ease with which electrons in a semiconductor material can be excited from the valence band to the conduction band depends upon the band gap, which is the energy difference between the two bands. The size of this energy band gap serves as a functional difference between semiconductors and insulators.

A semiconductor has an electrical conductivity of $10^{-2}$-$10^4$ S/cm, which is intermediate in magnitude between that of a conductor and insulator. In a semiconductor it may be more useful to think of the current as due to the flow of positive "holes." The current which flows in an intrinsic semiconductor consists of both electron and hole current. Electrons which have been freed from their lattice positions into the conduction band can move through the material. Additionally, electrons can jump between lattice positions to fill the vacancies left by the freed electrons. This additional mechanism is called hole conduction, and works as if the holes are migrating across the material in a direction opposite to the free electron movement.

In a semiconductor at a temperature above absolute zero, some electrons may produce a small current by being excited across the band gap and into the conduction band. These electrons crossing the gap each leave behind an electron vacancy or hole. Under the influence of an external voltage, both the electron and the hole can move across the material. In an n-type semiconductor, the dopant contributes extra electrons, which dramatically increases its conductivity. In a p-type semiconductor the dopant produces extra vacancies or holes, which likewise increases the conductivity. The behavior of a semiconductor junction is the key to a variety of solid-state electronic devices and will be discussed herein.

A material's band structure may be further described by the Fermi level, which is the hypothetical energy level that has a 50% probability of being occupied by an electron at any given time at thermal equilibrium. In doped semiconductors, p-type and n-type, the Fermi level lies in the band gap, in a position that is shifted to lower or higher energies by the type and amount of doping.

N-type semiconductors have a larger electron concentration than hole concentration. The phrase "n-type" describes the negative charge of the electron. In n-type semiconductors, electrons are the majority carriers, and holes are the minority carriers. N-type semiconductors are created by doping an intrinsic semiconductor with donor impurities. A common dopant for n-type silicon is phosphorus. In an n-type semiconductor, the Fermi level is greater than that of the intrinsic (undoped) semiconductor and lies closer to the conduction band than the valence band.

P-type semiconductors have a larger hole concentration than electron concentration. The phrase "p-type" describes the positive charge of the hole. In p-type semiconductors, holes are the majority carriers, and electrons are the minority carriers. P-type semiconductors are created by doping an intrinsic semiconductor with acceptor impurities. A common p-type dopant for silicon is boron. For p-type semiconductors, the Fermi level is below the intrinsic Fermi level and lies closer to the valence band than the conduction band.

Photocurrent is the electrical current through a photosensitive device, such as a photodiode, as the result of exposure to electromagnetic radiation. The photocurrent may be caused by the photoelectric or the photovoltaic effect. In the photovoltaic effect, when solar light or any other light is incident upon a material surface, the electrons present in the valence band absorb energy and, being excited, transition to the conduction band as unbound electrons. These highly excited, non-thermal electrons diffuse, and some reach a junction where they are accelerated into a different material by a built-in potential. This generates an electromotive force, and thus some of the light energy is converted into electric energy. In contrast, the photoelectric (or photoemissive) effect is when electrons are ejected from a material's surface into a vacuum upon exposure to light. When the ejected electron is captured by another electrode, some electric energy is generated. The photovoltaic effect differs as the excited electrons pass directly from one material to another, rather than passing through a vacuum.

As used herein, a photodiode is a semiconductor device that converts light into current. A current may be generated when photons are absorbed by the photodiode. A small amount of current, termed dark current, may also be produced when the photodiode is under a forward or reverse bias voltage with no light present.

Figure 2:
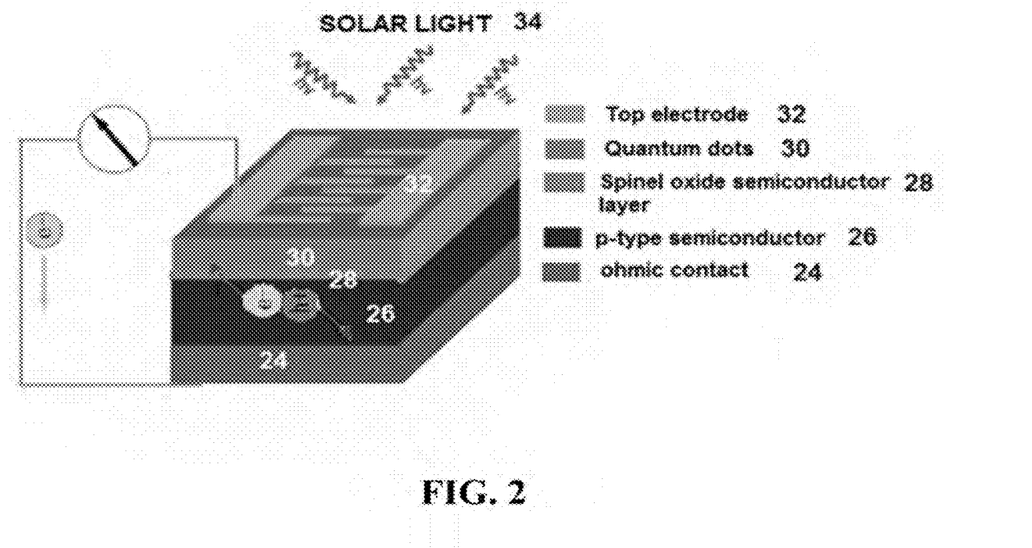
FIG. 2 is a diagram of the structure of a photodiode.

According to a first aspect, the present disclosure relates to a photodiode comprising an ohmic contact 24 having a first work function, an inorganic substrate layer 26 in continuous contact with the ohmic contact 24, a photoactive layer 28 in continuous contact with the inorganic substrate layer 26, a light absorption layer 30 in continuous contact with the photoactive layer 28, and a top electrode 32 in contact with the light absorption layer 30, where the top electrode 32 has a second work function. The inorganic substrate layer 26 of the photodiode comprises a semiconductor. The photoactive layer 28 comprises a spinel metal oxide of a general formula $A^{2+}(B^{3+})_2(O^{2-})_4$ where A and B are metal ions. The light absorption layer 30 of the photodiode comprises at least one material selected from the group consisting of quantum dots, quantum rods, and quantum wires. Also, the second work function of the top electrode 32 is greater than the first work function of the ohmic contact 24. Preferably the layers of the photodiode occupy parallel planes, though in an alternative embodiment, the layers may comprise curved surfaces.

The ohmic contact 24 may be considered a "bottom electrode," and may comprise copper, gold, silver, aluminum, nickel, indium, gallium, tungsten, molybdenum, palladium, titanium, cobalt, and/or platinum with a layer thickness of 50 nm-5 μm, preferably 75 nm-1 μm, more preferably 100 nm-500 nm. Alternatively, the ohmic contact 24 may comprise a different metal or a metal alloy having an electrical resistivity of at most $10^{-6}$ Ω·m, preferably at most $10^{-7}$ Ω·m at 20° C.

One side of the ohmic contact 24 is in continuous contact with the inorganic substrate layer 26, though in an alternative embodiment, the ohmic contact 24 may be applied as a pattern to the inorganic substrate layer 26, leaving exposed regions. The inorganic substrate layer 26 comprises a semiconductor. In one embodiment, the inorganic substrate layer 26 may contain more than 70 wt %, preferably more than 80 wt %, preferably more than 90 wt % semiconductor, and in a preferred embodiment, the inorganic substrate layer 26 is 100 wt %, or completely a semiconductor. Where the inorganic substrate layer 26 is less than 100 wt % semiconductor, the composition may also comprise an organic semiconductor matrix such as polyvinylcarbazole (PVK), poly(3-hexylthiophene) (P3HT), PBBDTTT-CT, phthalocyanine complex, a porphyrin complex, a polythiophene (PT), a derivative of polythiophene, a polycarbazole, a derivative of polycarbazole, a poly(p-phenylene vinylene) (PPV), a PPV derivative, a polyfulorene (PF), a benzodithiophene (BDT)-based polymer, a PF derivative, a cyclopentadithiophene-based polymer, a P3DOT, P3OT, PMeT, P3DDT, PDDTV, PQT, F8T2, PBTTT-C12, PFDDTBT, BisEH-PFDTBT, BisDMO-PFDTBT, PCDTBT or combinations and mixtures thereof. In one embodiment, the semiconductor comprises silicon, germanium, indium gallium arsenide, lead (II) sulfide, indium phosphor, and/or mercury cadmium telluride. In other embodiments, the semiconductor may be a group IV semiconductor, such as silicon or germanium, and may be doped with aluminum, boron, phosphorous, or gallium. Alternatively, the semiconductor may be a group III-V semiconductor such as aluminum phosphide, aluminum arsenide, gallium arsenide, or gallium nitride and doped with beryllium, zinc, cadmium, silicon, or germanium. In a preferred embodiment, the semiconductor is a p-type silicon based semiconductor, such as silicon doped with boron gallium, aluminum, nitrogen, or indium. However, in an another embodiment, the semiconductor may be an n-type semiconductor such as silicone doped with phosphorus, arsenic, antimony, bismuth, or lithium, or the semiconductor may be a non-silicon p-type semiconductor. In one embodiment, the inorganic substrate layer 26 has a layer thickness of 200-600 μm, preferably 300-500 μm, more preferably 350-450 μm. However, in other embodiments, the inorganic substrate layer 26 may have a thickness of less than 200 μm or greater than 600 μm. In one embodiment, the inorganic substrate layer 26 has a resistivity of 1-10 Ω·cm, preferably 2-9 Ω·cm, more preferably 3-8 Ω·cm.

Figure 3A:
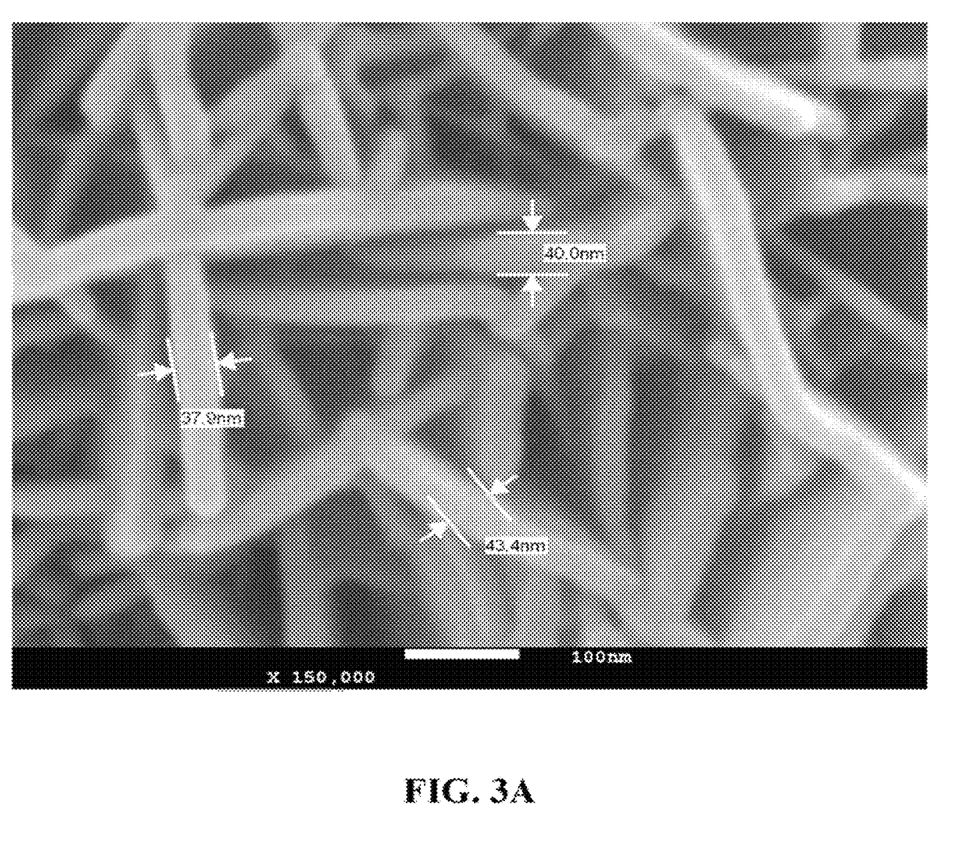
FIG. 3A is a scanning electron microscopy (SEM) image of $ZnFe_2O_4$ spinel oxide nanorods.
Figure 3B:
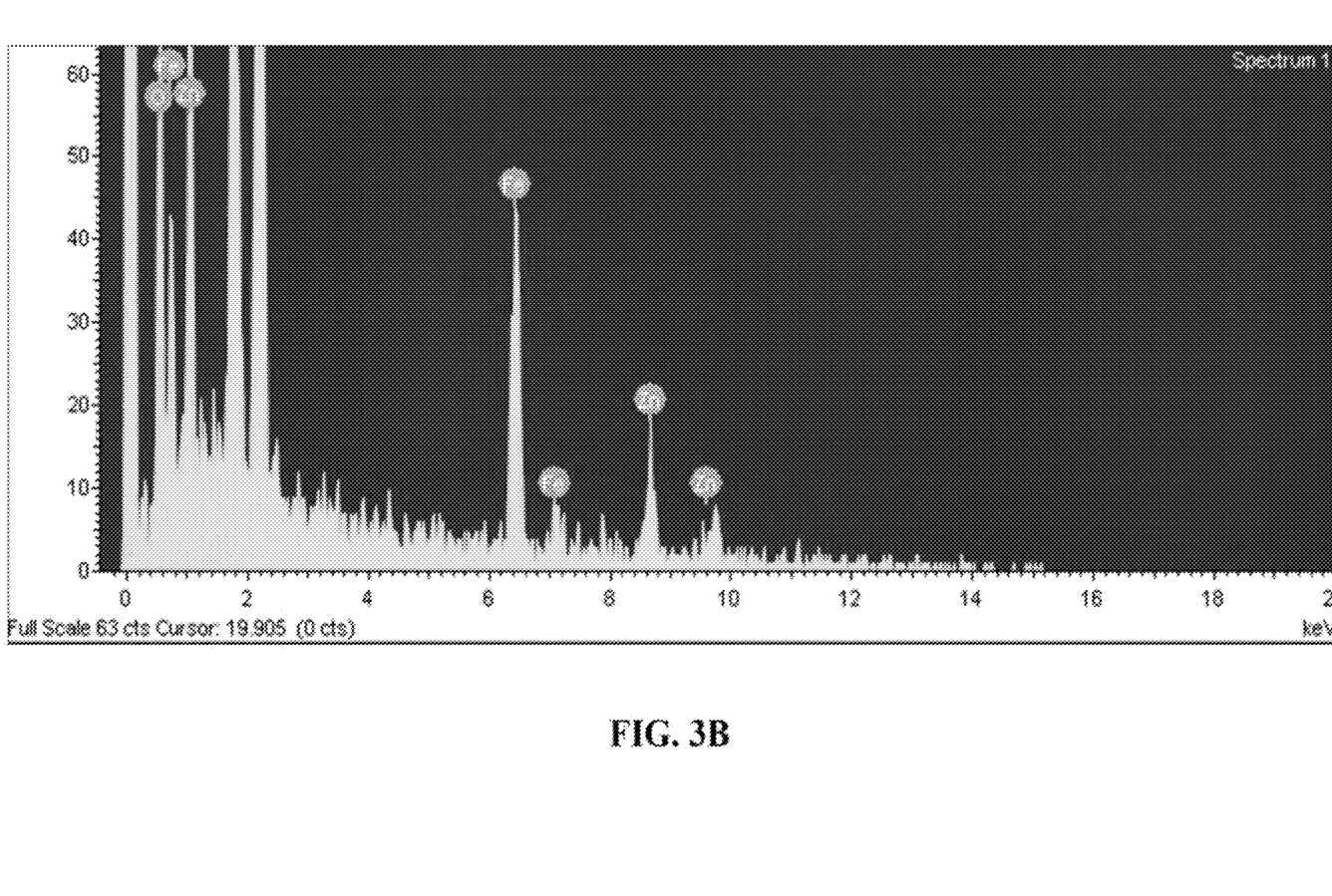
FIG. 3B is an electron diffraction spectroscopy (EDS) measurement of $ZnFe_2O_4$ spinel oxide nanorods.

A side of the inorganic substrate layer 26 not in contact with the ohmic contact 24 is in contact with the photoactive layer 28, and the photoactive layer 28 may have a thickness of 20-250 nm, preferably 30-200 nm, more preferably 50-100 nm. The photoactive layer 28 comprises a spinel metal oxide and may also be known as a "spinel oxide semiconductor layer." As defined here, a spinel metal oxide is a metal oxide with the formula $A^{2+}(B^{3-})_2(O^{2-})_4$ where "A" and "B" are metal ions. In one embodiment, "A" may be Zn, Cu, Co, Mn, Ni, Mg, Be, and/or Ti, while "B" may be Al, Fe, Cr, and/or V. In a preferred embodiment, "B" is Fe. In one embodiment, the spinel metal oxide has a direct optical band gap of 2.0-3.0 eV, preferably 2.1-2.9 eV, more preferably 2.2-2.8 eV. Preferably the spinel metal oxide is in the form of a crystal, with the oxide anions arranged in a cubic close-packed lattice, and with the metal ions occupying octahedral and/or tetrahedral sites within the lattice. Preferably the $A^{2+}$ metal ions occupy the tetrahedral sites, and the $B^{3+}$ metal ions occupy the octahedral sites, though there may be instances where the metal ions are switched. The $A^{2-}$ and $B^{3+}$ metal ions may occupy sites in the lattice at regular spacings or may be distributed randomly. In one embodiment, the spinel oxide may be in the form of different nanostructured materials, including, but not limited to nanowires, nanorods, tetrapods, nanobelts, nanoflowers, nanoparticles, nanoflakes, nanosheets, nanospheres, nanoreefs, nanotubes, nanocylinders, nanoboxes, and/or nanostars. In a preferred embodiment, the spinel oxide may be in the form of nanorods or nanowires. For instance, FIG. 3A shows an SEM image of a $ZnFe_2O_4$ spinel oxide in the form of nanowires having widths of 35-45 nm and lengths of about 170-350 nm, and FIG. 3B shows an electron diffraction spectrum measurement. Different nanostructures and compositions of spinel metal oxides may have different optical properties, for instance, different direct optical band gaps.

In one embodiment, the spinel metal oxide is $ZnFe_2O_4$, $CuFe_2O_4$, $CoFe_2O_4$, $MnFe_2O_4$, and/or $NiFe_2O_4$, and in a preferred embodiment, the spinel metal oxide is $ZnFe_2O_4$. In other embodiments, the spinel metal oxide may be $MgAl_2O_4$, $BeAl_2O_4$, $ZnAl_2O_4$, $FeAl_2O_4$, $MnAl_2O_4$, $MgFe_2O_4$, $(Fe^{2+})(Fe^{3+})_2O_4$, $TiFe_2O_4$, $FeCr_2O_4$, $MgCr_2O_4$, $ZnCr_2O_4$, $FeV_2O_4$, or $MgV_2O_4$. In some embodiments, the spinel oxide may comprise a mixture of different metal ions with the same charge, for example, $(Mg_xFe_{1-x})Al_2O_4$ where "x" is between 0 and 1 exclusive. Different metal ions having the same charge may be distributed at regular spacings throughout the crystal lattice tetrahedral and octahedral sites, or may be randomly distributed. In alternative embodiments, other metal oxides having similar structures may be used despite not being spinel metal oxides. For example, these metal oxides may be $(Mg,Fe)_2SiO_4$, $BeMgAl_4O_8$, or $(Mg,Fe,Zn)_2BeAl_6O_{12}$. In another embodiment, the spinel metal oxide may be doped with 0.5-2 wt % of a doping agent to change an electronic property, for instance, by introducing electron holes or valence electrons, similar to doping a silicon-based semiconductor. The doping agents may include silicon, phosphorous, boron, alkaline-earth metals (such as Ca, Ba, or Sr), alkali metals (such as Na, K, Li), gallium, germanium, arsenic, indium, antimony, bismuth, or lead. In one embodiment, the photoactive layer 28 may comprise 100 wt % spinel metal oxide. In another embodiment, the photoactive layer 28 may comprise 70-99 wt %, 80-98 wt %, or 85-95 wt % spinel metal oxide within a semiconductor matrix. The semiconductor matrix may be an inorganic semiconductor or organic semiconductor material as mentioned previously. The semiconductor matrix on its own may have a band gap energy higher or lower than the band gap energy of the spinel metal oxide on its own. In another embodiment, the semiconductor matrix may have a similar band gap energy but may be present to modify other electronic or optical properties of the photoactive layer 28. Likewise, a matrix material may be used to support the structure or dispersion of the spinel metal oxide, and this matrix material may not significantly contribute or change the optical properties of the photoactive layer 28. In one embodiment, the matrix material may be a polymer matrix of polymethylmethacrylate (PMMA), polystyrene, polyimides, or some other polymer to encapsulate a nanostructured spinel oxide and restrict the movement of individual particles or structures. In one embodiment, a nanostructured spinel metal oxide may be on the inorganic substrate layer 26 without a matrix and comprise 70-95 vol %, or 80-90 vol % of the photoactive layer 28, with the remaining volume comprising air or an inert gas, such as Ar or $N_2$. In another embodiment, the spinel metal oxide may be a solid layer on the inorganic substrate layer 26, and comprise 100 wt % spinel metal oxide. In one embodiment, a spinel metal oxide comprising nanostructures has some or all nanostructures chemically bonded and/or physically adsorbed to the inorganic substrate layer 26 and/or the light absorption layer 30. In another embodiment, a matrix material of the photoactive layer 28 may be chemically bonded and/or physically adsorbed to the inorganic substrate layer 26 and/or the light absorption layer 30.

In one embodiment, the inorganic substrate layer 26 and the photoactive layer 28 form an isotype junction. This means that the two layers are semiconductors in direct contact and both comprise the same type of majority charge carriers. For instance, both layers may be "p-type" or hole-conducting, where the holes are the majority carriers and electrons are the minority carriers. Alternatively, both layers may be "n-type" or free-electron conducting, where electrons are the majority carriers and the holes are the minority carriers. The inorganic substrate layer 26 and the photoactive layer 28 may have similar concentrations for a particular majority carrier, or they may have different concentrations for a particular majority charge carrier. Alternatively, the inorganic substrate layer 26 and the photoactive layer 28 may have similar concentrations but different motilities of a certain majority charge carrier. In a preferred embodiment, both layers are "p-type," or hole-conducting semiconductors.

The light absorption layer 30 of the photodiode comprises nanomaterials such as quantum dots, quantum rods, and/or quantum wires. The light absorption layer 30 may comprise 65-99 wt %, preferably 70-95 wt %, more preferably 80-90 wt % nanomaterials, with the remaining composition comprising an inorganic or organic semiconductor matrix as mentioned previously, or a polymer matrix as described previously to encapsulate the nanomaterial and restrict the movement of individual particles. This non-nanomaterial composition may be chosen to modify an optical or electronic property of the light absorption layer 30, such as a dye. The dye may be coumarin, an organic laser dye, a porphyrin derivative, an inorganic complex of ruthenium, osmium, or iron, riboflavin, eosin, rose bengal, rhodamine B, cyanine, calconcarboxylic acid, or some other dye. Alternatively, the non-nanomaterial may not contribute significantly to the optical or electronic properties. Similar to what was previously mentioned for the spinel metal oxide, the light absorption layer 30 may also comprise air or an inert gas. One or more components of the light absorption layer 30 may be chemically bonded or physically adsorbed to the photoactive layer 28.

In one embodiment, the light absorption layer 30 has a thickness of 10-100 nm, preferably 15-80 nm, more preferably 20-70 nm, though in an alternative embodiment, the light absorption layer 30 may have a thickness less than 10 nm or greater than 100 nm. Preferably the light absorption layer 30 is able to absorb light of a wavelength 150-1500 nm, more preferably 200-1200 nm, even more preferably 400-1000 nm. This absorption property may be a result of the quantum dots, quantum rods, and/or quantum wires having a band gap energy that corresponds to a wavelength within or larger than that wavelength range. Preferably the nanostructure of the quantum dot, rod, or wire is able to confine conduction band electrons, valence band holes, or excitons (bound pairs of conduction band electrons and valence band holes) in all three spatial directions. This confinement may be due to electrostatic potentials (such as those generated by external electrodes, doping, physical strain, or impurities), the presence of an interface between two semiconductor materials (such as in core-shell or layered nanostructures) or at the interface between a semiconductor and another material. For example, a semiconductor may be decorated by organic ligands or covered by a dielectric. This dielectric may be an oxide such as PbO, a sulfite such as $PbSO_3$, a sulfate such as $PbSO_4$, or $SiO_2$. In addition, the confinement property may arise from the presence of the photoactive layer 28. Due to this confinement, quantum dot, rod, or wire nanostructure exhibits in its absorption spectrum the effects of a discrete quantized energy spectrum of an idealized zero-dimensional system. The wave functions that correspond to this discrete energy spectrum are substantially spatially localized within the nanostructure, but may extend over many periods of the crystal lattice of the material.

As defined herein, quantum dots are nanoparticles having longest and shortest dimensions within 1-15 nm, where the ratio of the longest to shortest dimension is 1:1-1.5:1, preferably 1:1-1.2:1. Quantum dots may have a spherical or rounded shape, a cubic shape, or some other shape. As defined herein, quantum rods are nanoparticles having a shortest dimension of 1-15 nm and a longest dimension of 2-50 nm, where the ratio of the longest to shortest dimension is 1.5:1-5:1, preferably 2:1-4:1. The quantum rods may have a cylindrical shape, a rectangular shape, an ellipsoidal shape, or may be some other elongated shape. As defined herein, quantum wires are nanoparticles having a shortest dimension of 1-15 nm and a longest dimension of 50 nm-1 µm, where the ratio of the longest to shortest dimension is 5:1-1,000:1, preferably 8:1-100:1. In another embodiment, the nanostructures of the light absorption layer 30 may have other shapes, such as those listed previously for the spinel metal oxide.

In one embodiment the nanomaterials of the light absorption layer 30 comprise lead sulfide (PbS), lead selenide (PbSe), lead telluride (PbTe), cadmium selenide (CdSe), cadmium sulfide (CdS), and/or cadmium telluride (CdTe). In other embodiments the quantum dots, quantum rods, and/or quantum wires may comprise other materials such as cesium lead halide perovskites ($CsPbX_3$, where X=Cl, Br, or I), indium arsenide (InAs), indium phosphide (InP), indium gallium arsenide (InGaAs), cadmium selenide sulfide (CdSeS), zinc sulfide (ZnS), silicon (Si), or some other semiconductor material. The surface of the nanomaterials may be passivated by physical adsorption or chemical attachment of ligands. These ligands may be thiol-terminated ligands such as benzenethiol, ethanethiol; carboxylate-terminated molecules such as oleic acid and formic acid; amine-terminated ligands such as pyridine, butylamine, or octylamine; bidentate crosslinkers such as benzenedithiol, ethanedithiol, or butanedithiol. The ligands may include multidentate molecules that have a backbone, certain side-groups and/or end-groups that bind to the nanoparticle surface, and other functional groups that may confer solubility in polar, nonpolar, and partially polar solvents. In another embodiment, the ligand may be an organophosphorous compound such as trioctylphosphine oxide (TOPO). Alternatively, the surface of the nanostructures may have a dielectric, such as those mentioned previously. In one embodiment, the nanostructure can have a core-shell structure with a semiconductor core, such as PbS. In some embodiments, the cores of adjacent nanostructures may be fused together to form a continuous film of nanocrystal material to allow current to flow more easily while retaining nanoscale quantum effects.

In one embodiment the light absorption layer 30 may contain a mixture of nanomaterials with one or more different properties of shape, size, or composition. For instance, a light absorption layer 30 may comprise 2-12 nm, preferably 4-11 nm, more preferably 5-10 nm cubic PbS quantum dots and 3-10 nm, preferably 4-9 nm, more preferably 5-8 nm hexagonal prism CdSe quantum dots at a mass ratio of 1:1-1:10, preferably 1:1-1:5, more preferably 1:2-1:3. Alternatively, a light absorption layer 30 may comprise PbSe in the form of quantum dots, rods, and wires having a distribution of shapes spanning from widths of 5 nm to lengths of 1 µm. In one embodiment, nanomaterials may be alloyed or comprise a core-shell structure. For instance, a quantum dot may comprise a CdSe core of 3-6 nm diameter surrounded by a ZnS shell layer with a 1-2 nm thickness. Preferably the optical properties of the light absorption layer 30 may be adjusted by changes to its thickness or changes to the abovementioned properties of the nanomaterial.

In one embodiment, the optical band gap of the photoactive layer 28 is greater than the optical band gap of the light absorption layer 30, preferably by at least 0.2 eV, more preferably by at least 0.4 eV. However, in an alternative embodiment, the optical band gap of the photoactive layer 28 is equal to or less than the optical band gap of the light absorption layer 30.

The top electrode 32 may comprise a conductive metal or metal alloy such as those mentioned previously for the ohmic contact 24. In one embodiment, the top electrode 32 is aluminum.

In one embodiment, the top electrode 32 does not completely cover the photoactive layer 28. For instance, the top electrode 32 may exist as a plurality of circles with diameters of 0.5-3 mm, preferably 0.5-2 mm, more preferably 0.8-1.2 mm, and having a nearest neighbor spacing of 0.5-10 mm, preferably 0.8-5 mm. The circles may be arranged in a hexagonal or square array, and may cover 5-50%, preferably 8-40%, more preferably 10-20% of the surface of the photoactive layer 28. Alternatively, the top electrode 32 may comprise rectangles, squares, or some other shape with widths similar to the previously mentioned circle diameters. In one embodiment, the circles may be electrically connected to one another by a strip of conductive metal on the surface of the photoactive layer 28. Alternatively, the circles may be electrically connected to one another by wires or other forms of conductive metal that do not make contact with the surface of the photoactive layer 28. In another embodiment, the top electrode 32 may comprise interweaving lines as illustrated by the top electrode 32 in FIG. 2. The lines may have widths and spacings of 0.1-5 mm, preferably 0.2-2 mm, more preferably 0.3-1 mm.

The top electrode 32 may have a layer thickness of 50 nm-5 µm, preferably 75 nm-1 µm, more preferably 100 nm-500 nm, and may be formed by evaporating or sputtering a metal onto the photoactive layer 28. In an alternative embodiment, the top electrode 32 forms a contiguous layer and completely covers the photoactive layer 28. In this alternative embodiment, the top electrode 32 may have an overall thickness or regions of different thicknesses that enable it to be transparent, and the top electrode may comprise at least one of indium tin oxide (ITO), cadmium tin oxide, fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

Preferably the ohmic contact 24 and the top electrode 32 are each able to electrically connect to a separate wire and/or charged surface. The ohmic contact 24 may form a cathode and the top electrode 32 may form an anode. As mentioned previously, the work function of the top electrode 32 is greater than the work function of the ohmic contact 24, preferably by at least 0.2 eV, more preferably by at least 0.5 eV. As used herein, the work function refers to the minimum energy needed to remove an electron from a solid to a point in the vacuum immediately outside the solid surface on an atomic scale. The work function is not a characteristic of a bulk material, but rather a property of the surface of the material. In general, the work function tends to be smaller for metals with an open lattice, and larger for metals in which the atoms are closely packed. It is somewhat higher on dense crystal faces than open crystal faces, also depending on surface reconstructions for the given crystal face. The work function can also be determined by physical factors including, but not limited to, surface dipoles, doping, and electric field effects. In an alternative embodiment, the work function of the top electrode 32 may be less than or equal to the work function of the ohmic contact 24.

In an alternative embodiment, a photodiode may be fabricated with a missing layer and yet still function as a photodiode or a rectifying diode. For instance, one layer selected from the light absorption layer 30, the photoactive layer 28, or the inorganic substrate layer 26 may be omitted from the structure while retaining other layers. As each of these two layers may have semiconductor properties, a photodiode with a missing layer may still be able to form a P-N junction, or an isotype P-P or N-N junction.

As mentioned previously, the top electrode 32 may be in contact but not continuous contact with the light absorption layer 30, as shown in FIG. 2. In a related alternative embodiment, other layers of the photodiode may be in contact, but not in continuous contact with an adjacent layer. For example, the ohmic contact 24 and the inorganic substrate layer 26 may be in contact but not in continuous contact. Alternatively, the photoactive layer 28 and the inorganic substrate layer 26 may be in contact but not in continuous contact. Alternatively, the light absorption layer 30 may be in contact with the photoactive layer 28 but not in continuous contact. Where two layers are in contact without being in continuous contact, one or both layers may be patterned with different structures, such as those mentioned previously for the light absorption layer 30. The voids where adjacent layers are not in contact may be filled with air, an inert gas, an insulating material, a conductive metal as described previously, or a semiconductor (inorganic or organic), or polymer material as described previously. The void may also be filled with a buffer layer material. In one embodiment, where layers are in contact but not in continuous contact, the voids may be patterned corrals meant to segment regions of the photodiode or form separate cells.

In a related alternative embodiment, a photodiode may be fabricated with one or more additional buffer layers to block current leakage, to block light passage, or to provide some other functionality. The one or more buffer layers may comprise materials such as a metal oxide (for example, tin oxide, indium oxide, calcium oxide, titanium oxide, zinc stannate, and/or zinc oxide), LiF, CsF, LiCoO$_2$, Cs$_2$CO$_3$, Al$_2$O$_3$, bathocuproine (BCP), copper phthalocyanine (CuPc), pentacene, pyronin B, pentadecafluorooctyl phenyl-C$_{60}$-butyrate (F-PCBM), C$_{60}$/LiF, ZnO nanorods/PCBM, ZnO/cross-linked fullerene derivative (C-PCBSD), polyethylene glycol (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer-bearing cationic groups in the alkyl side chains (PFPNBr), polyethylene oxide (PEO), fullerene and derivatives thereof, a perylene derivative, a 2,7-dicyclohexyl benzo[lmn][3,8]phenanthroline derivative, a 1,4-diketo-3,6-dithienylpyrrolo[3,4-c]pyrrole (DPP) derivative, a tetracyanoquinodimethane (TCNQ) derivative, indene-C$_{60}$ bisadduct ([60]ICBA), indene-C$_{70}$ bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C$_{61}$-butyric acid methyl ester (PCBM), [6,6]-phenyl C$_{61}$-butyric acid methyl ester (PC70BM), [6,6]-(4-fluoro-phenyl)-C$_{61}$-butyric acid methyl ester (FPCBM), carbon 60 (C$_{60}$), carbon 70 (C$_{70}$), carbon nanotube (CNT), or combinations thereof. These additional buffer layers may also comprise one or more inorganic or organic semiconductor matrix material or polymer matrix material as mentioned previously. One or more buffer layers may form chemical bonds to one or more adjacent surfaces, and/or may be physically adsorbed, though some buffer layers may sit in direct contact without adsorption or chemical bonding. The one or more buffer layers may be any thickness as previously discussed for the other components of the photodiode, or a smaller thickness, and may have a constant or varying thickness throughout its volume. Additionally, one or more buffer layers may not be in continuous contact with adjacent layers. In another related alternative embodiment, the top electrode 32 and optionally, the light absorption layer 30, may be coated with a transparent layer to protect the photodiode but allow passage of light to the light absorption layer 30.

In one embodiment, the photodiode has a barrier height of 0.5-1.25 eV, preferably 0.6-1.1 eV, more preferably 0.7-1.0 eV. As used herein, the barrier height refers to a potential energy barrier for electrons formed at a junction between a metal and a semiconductor. This may also be called a Schottky barrier height and may be denoted by the symbol $\Phi_B$. This energy barrier is rectifying, meaning that the junction may only conduct current in one direction. However, in other embodiments, the photodiode may have a lower or negligible barrier height, where the metal and semiconductor junction allows current flow in both directions.

Figure 5:
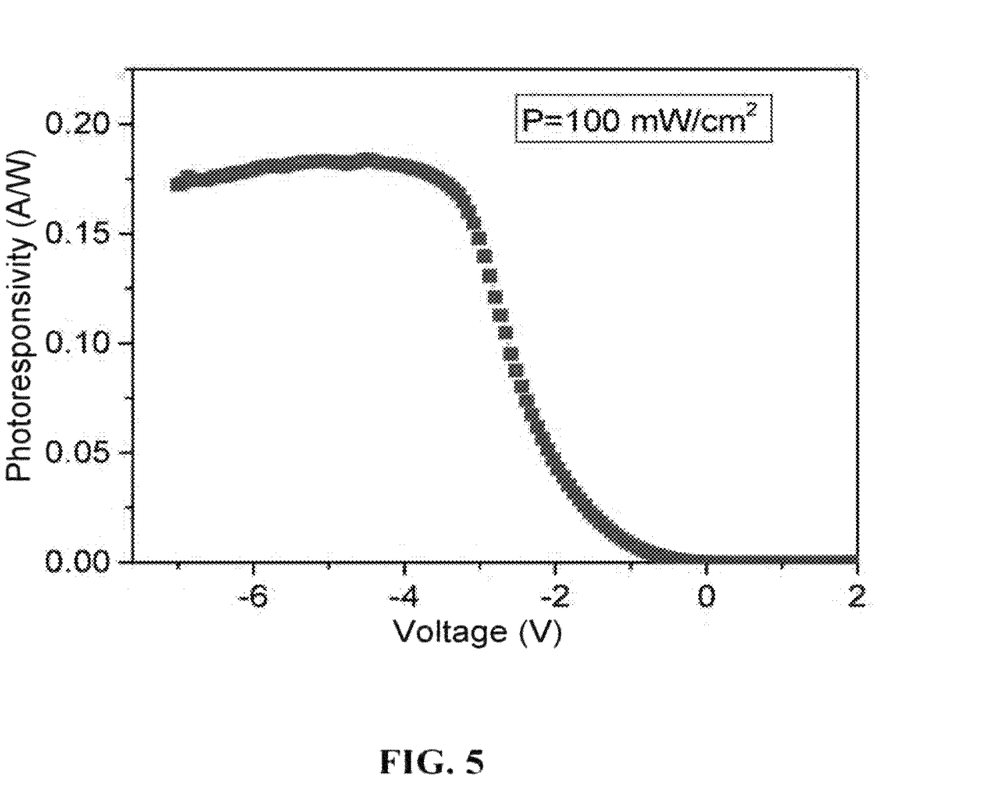
FIG. 5 is a plot of a photodiode's photoresponsivity at different bias voltages and with an illumination intensity of 100 mW/cm$^2$.

In one embodiment, the photodiode has a photoresponsivity of 0.10-0.40 A/W, preferably 0.20-0.40 A/W, more preferably 0.25-0.35 A/W. In one embodiment, these photoresponsivity values arise at a reverse bias voltage of 3-8 V, preferably 4-7 V, and under an illumination power density of 100 mW/cm$^2$. As used herein, the photoresponsivity is a ratio of the photodiode's generated photocurrent to the incident radiation power. FIG. 5 shows a plot of an exemplary photodiode's photoresponsivity to bias voltage. In one embodiment, the photodiode's density of interface states relates to its photoresponsivity. For example, increasing the density of interface states from $1 \times 10^{11}$ eV$^{-1}$ cm$^{-2}$ to $1 \times 10^{13}$ eV$^{-1}$ cm$^{-2}$ may cause the photoresponsivity to increase from 0.2 A/W to 0.4 A/W. As defined here, the density of interface states refers to the density of energy levels at the surface between a semiconductor and a conductor. These interface states may also be called interface traps, and arise as a result of the unpaired valence electrons at the face of the semiconductor. These unpaired valence electrons may interfere with passing current. The density of interface states and the photoresponsivity may both be influenced by the frequency and direction of a bias current applied to the photodiode. In one embodiment, the interface states can follow an alternating bias current at low frequencies and can contribute to the total capacitance of the photodiode. However, at high frequencies, the interface states cannot follow the current and thus do not contribute significantly to the capacitance of the diode. The density of interface states may also depend on the orientation of the semiconductor lattice.

The ideality factor, n, of the photodiode may be 1-6, preferably 2-5. The ideality factor is a dimensionless quantity that can be derived from the slope of the linear part of the forward bias semi-log I vs. V plot through the relation:

$$n = \frac{q}{kT}\frac{dV}{d\ln(I)},$$

where q is the electronic charge, V is the applied voltage, k is Boltzmann's constant, T is the temperature in Kelvin, and I is the current.

Figure 4:
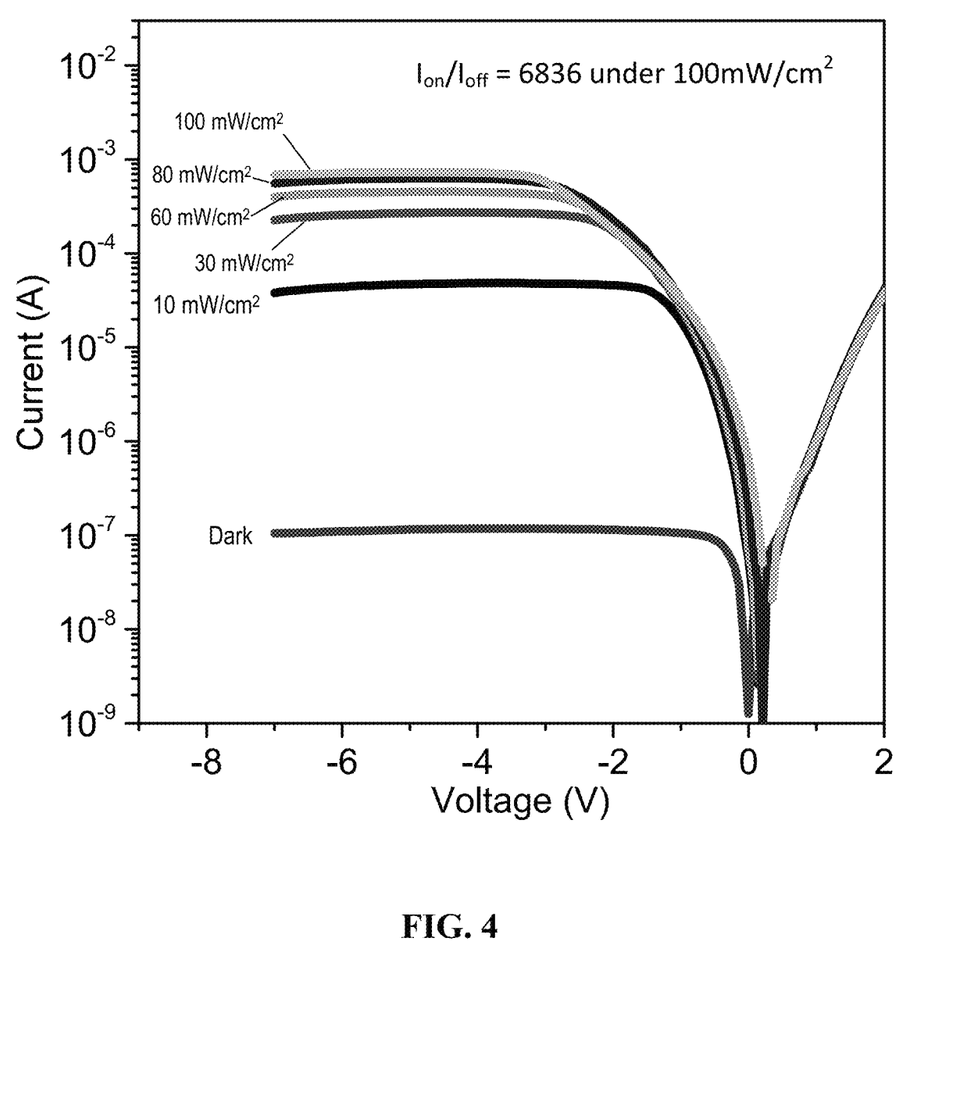
FIG. 4 is a plot of the current of a photodiode at different bias voltages and at different illumination intensities.
Figure 6:
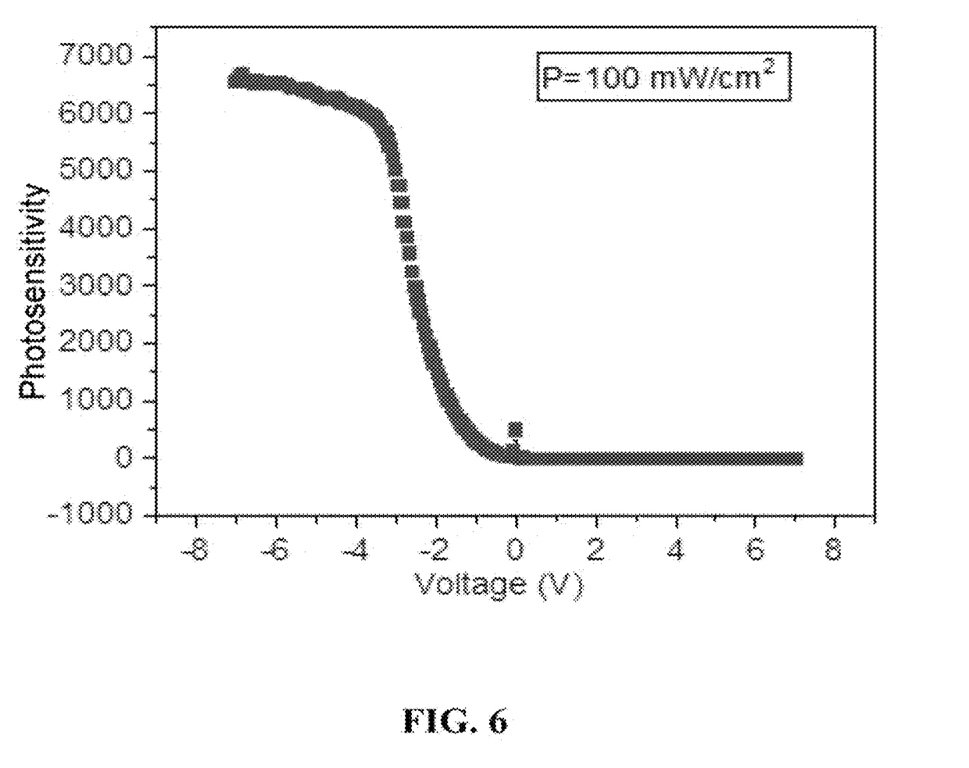
FIG. 6 is a plot of a photodiode's photosensitivity at different bias voltages and with an illumination intensity of 100 mW/cm$^2$.

In one embodiment, the photodiode has a photosensitivity of 6000-7500, preferably 6500-7000 at a bias of 5.0-8.0 V, preferably 6.0-7.5 V. Preferably the bias of 5.0-8.0 V is applied as a reverse bias, with the positive voltage applied to the cathode (ohmic contact 24) and the negative voltage applied to the anode (top electrode 32). The value of photosensitivity used here is the ratio of the photodiode's photocurrent to dark current, and in some cases, the photosensitivity may be called the photocurrent gain. FIG. 6 shows a plot of an exemplary photodiode's photosensitivity over a range of forward (positive) and reverse (negative) bias voltages and under an illumination power density of 100 mW/cm$^2$. FIG. 4 shows a photocurrent vs. bias voltage plot of an exemplary photodiode under different illumination power densities. An increasing power density increases the photocurrent when a reverse bias voltage (negative voltage value) is applied. With forward bias voltages, the illumination power density produces a negligible difference on the amount of photocurrent. This behavior at forward and reverse bias voltages is typical for a photodiode.

According to a second aspect, the present disclosure relates to a method for forming the photodiode of the first aspect. These steps involve depositing the ohmic contact 24 onto the inorganic substrate layer 26; spin or drop coating the spinel metal oxide onto the inorganic substrate layer 26, to form the photoactive layer 28; spin or drop coating quantum dots, quantum rods, or quantum wires onto the photoactive layer 28, thereby forming the light absorption layer 30; and depositing the top electrode 32 onto the light absorption layer 30. Each layer may be added or deposited to the layer thicknesses such as those mentioned previously for the photodiode. However, in alternative embodiments, one or more layers may have a thickness that is greater or less than that previously mentioned. In some embodiments, a layer deposition step may be repeated in order to increase its thickness.

Figure 1:
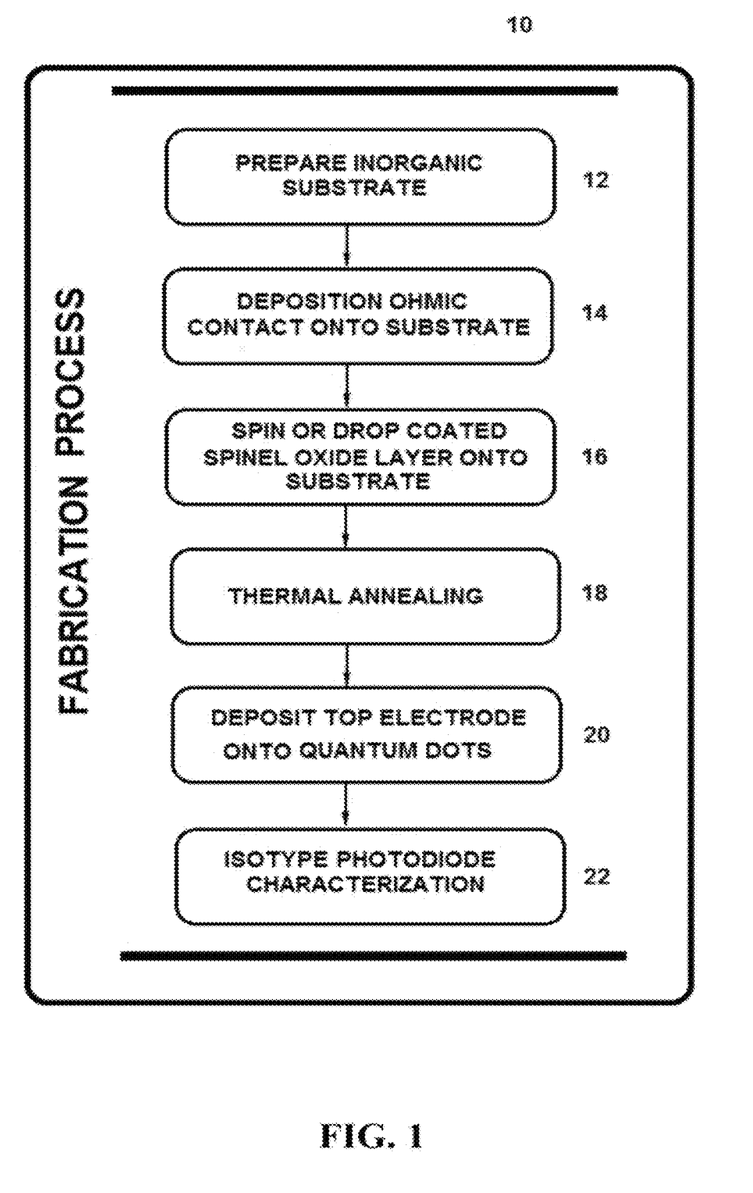
FIG. 1 shows an example of a method for forming a photodiode.

Fabrication steps are outlined in the flowchart 10 of FIG. 1. Here, an inorganic substrate layer 26 is obtained. This inorganic substrate layer 26 is a semiconductor, and may be in the form of a silicon wafer. In a preferred embodiment, the semiconductor is a p-type silicon semiconductor, though in other embodiments it may be n-type or a non-silicon semiconductor such as those listed previously. This inorganic substrate layer 26 may have a thickness and other properties such as those listed previously, and may be prepared for fabrication 12 by cleaning in a chemical bath and/or sonication. For example, the chemical bath may be one or more organic solvents such as acetone, methanol, ethanol, hexane, or isopropanol. The inorganic substrate layer 26 may be rinsed with the organic solvents or submerged and soaked for 1-18 hours, preferably 2-5 hours. Alternatively, the inorganic substrate layer 26 may be submerged and sonicated in the chemical bath for 1-30 min, preferably 5-10 min. Preferably, after cleaning with an organic solvent, the inorganic substrate layer 26 may be rinsed with distilled or deionized water. Alternatively, the inorganic substrate layer 26 may be cleaned by sonicating in distilled or deionized water and without using an organic solvent. Following the cleaning with organic solvent or water, the inorganic substrate layer 26 may be dried under a stream of Ar or N$_2$ gas, or in a desiccator.

The ohmic contact 24 may then be deposited 14 onto one surface of the inorganic substrate layer 26. This deposition may be a metal deposition and accomplished through thermal evaporation of the metal, for example, at a pressure of $10^{-4}$-$10^{-8}$ Torr, preferably $10^{-4}$-$10^{-6}$ Torr. In another embodiment, the metal may be deposited 14 through metal sputtering, e-beam evaporation, or pulsed laser deposition. In another embodiment, the metal may be pre-formed as a thin plate or foil, and may be deposited 14 by placing it onto the surface of the inorganic substrate layer 26. The metal may be any of those listed previously for the ohmic contact 24.

The spinel oxide may then be spin or drop coated 16 onto a second surface of the inorganic substrate layer 26 at a spinning rate of 1,000-8,000 RPM, preferably 2,000-6,000 RPM. Alternatively, the spinel oxide may be deposited by an ink-jet printing process, Langmuir-Blodgett film deposition, electrokinetic spray, a dip coating process, or nano-imprint. Here the spinel oxide may be suspended in a solution at a concentration of 0.01-60 wt %, preferably 0.1-65 wt %, more preferably 1-50 wt %. The solvent may be ethanol amine, toluene, chloroform, pyridine, isopropanol, butanol, acetone, ethanol, ethylene glycol, and/or water. In one embodiment, metal nitrate salts may be used with ethanol to form the spinel oxide. The metal nitrate salts may have a concentration of 0.1 M-2 M, preferably 0.2-1 M, more preferably 0.3-0.8 M. In another embodiment, metal chloride salts may be used with ethanolamine at a similar concentration range to form the spinel oxide. The spinel oxides formed may be in the form of different nanostructured materials as mentioned previously.

The layer thickness may be controlled by the spinning rate, the volume of solution added, and the number of layers deposited. The spinel oxide layer may also be called the photoactive layer 28. In one embodiment, the inorganic substrate layer 26 may be dried after one or more spin or drop coatings by heating in an oven or on a hot plate at 150-250° C. for 4-15 minutes to evaporate the solvent. Alternatively, the inorganic substrate layer 26 may be left to dry in a desiccator at room temperature. Then, a solution of quantum dots, quantum rods, and/or quantum wires may be deposited onto the spinel oxide layer by spin coating, drop coating, dip coating, ink-jet printing, Langmuir-Blodgett film deposition, electrokinetic spray, or nano-imprint. The quantum dots, quantum rods, and/or quantum wires may be suspended in a solvent such as those mentioned previously, at a concentration of 0.01-60 wt %, preferably 0.1-65 wt %, more preferably 1-50 wt %. In one embodiment, quantum dots may be used at a concentration of 0.1-2.0 M, preferably 0.2-1.0 M, more preferably 0.3-0. M in ethanol or methanol.

The layer of quantum dots, rods, and/or wires forms the light absorption layer 30 of the photodiode.

The inorganic substrate layer 26 having the ohmic contact 24 and the photoactive layer 28 may undergo thermal annealing 18. For this, the inorganic substrate layer 26 may be heated at 400-800° C., preferably 500-750° C., more preferably 600-725° C. for 30 min-3 h, preferably 45 min-1.5 h. In one embodiment, the inorganic substrate layer 26 having the ohmic contact 24 and the photoactive layer 28 may be heated at a lower temperature before and/or after the annealing. This heating may be at 100-200° C., preferably 110-180° C., more preferably 130-170° C. in air for 4-30 min, preferably 5-20 min, more preferably 8-15 min. In an alternative embodiment, the inorganic substrate layer 26 is not annealed.

In one embodiment, the light absorption layer 30 may be deposited after the thermal annealing, and then undergo a second annealing step by heating at 150-400° C., preferably 160-300° C., more preferably 180-250° C. for 4-30 min, preferably 5-20 min, more preferably 8-15 min. In an alternative embodiment, the thermal annealing step may come after the photoactive layer 28 and the light absorption layer 30 have been deposited.

Next, a metal may be deposited 20 onto the light absorption layer 30 to form the top electrode 32. This creates the photodiode. Preferably the metal is deposited 20 by evaporation through a patterned mask in order to not completely cover the surface of the light absorption layer 30. The metal may be deposited 20 as patterns as mentioned previously. In a preferred embodiment, the metal may be evaporated through a shadow mask having an array of 1 mm diameter circles. In one embodiment the metal is deposited without a patterned mask and is instead patterned afterwards by chemical etching. In another embodiment, the metal may be pre-formed as a thin plate or foil, and may be placed onto the light absorption layer 30. In this embodiment, the metal may be cut or etched into a pattern before being placed, or the metal may be placed and then cut or etched into a pattern.

The photodiode may be housed in a casing to connect electrical leads to the top electrode 32 or ohmic contact 24 and/or protect the photodiode surface. This casing may comprise an insulated metal, of such metals as those listed previously, a polymeric material such as polylactic acid (PLA), poly(lactic-co-glycolic acid) (PLGA), polyethylene terephthalate (PET), acrylonitrile butadiene styrene (ABS), and/or polytetrafluoroethylene (PTFE), or some other non-metal, such as glass or ceramic. Preferably the casing has an opening or transparent window to allow the passage of incident light. The photodiode may then be characterized 22 for its optoelectric properties, including, but not limited to photoresponsivity, photosensitivity, resistance, capacitance, response time, and barrier height. This type of testing may be completed using instrumentation such as a Kiethley 4200 semiconductor characterization system, or some other parameter analyzer. The photodiode may be tested with illumination from one or more wavelengths in the range of 150-1,500 nm, preferably 200-1,000 nm, and irradiating the photodiode with a power density of 1-1,000 mW/cm$^2$, preferably 10-500 mW/cm$^2$, more preferably 20-200 mW/cm$^2$. The irradiation may be generated from a flame, a lantern, a gas discharge lamp, an incandescent bulb, a laser, a fluorescent lamp, an electric arc, a light emitting diode (LED), a cathode ray tube, solar light 34, and/or some other source of light, and may be manipulated with filters, shutters, reflectors, diaphragms, optical fibers, or other optics. A light power meter may be used to measure the intensity and optionally the wavelength of the irradiated light.

According to a third aspect, the present disclosure relates to a method of generating an electronic current using the photodiode of the first aspect. This method involves irradiating the photodiode of the first aspect with a light source having a wavelength of 150-1500 nm. In one embodiment, the light may be of a wavelength, power density, and source as mentioned previously. In one embodiment, the light absorption layer 30 absorbs light of a certain energy and fluoresces or phosphoresces light of a lower energy, which may go on to interact with the photoactive layer 28. A forward or reverse bias voltage of −10 to 10 V, preferably −7 to 7 V, more preferably −6 to 6 V may be applied to the photodiode.

In another embodiment, the light absorption layer 30 may be designed as a filter, where it to absorbs or reflects light of certain properties while allowing other light to pass through to the spinel oxide semiconductor. These properties may be based on the wavelength, polarization, and/or incidence angle of the light.

In some embodiments, a light absorption layer 30 may be designed to maximize certain wavelengths of light arriving to the spinel oxide semiconductor from a broad wavelength light source. For example, a light absorption layer 30 may absorb solar light 34 having wavelengths in the range 250-450 nm, while transmitting or allowing light of 550 nm wavelength and higher to pass through. The light absorption layer 30 may phosphoresce or fluoresce the absorbed energy as light with wavelengths above 550 nm, which light then irradiates the spinel oxide semiconductor to produce electron hole pairs. Thus, the light absorption layer 30 may be used to change the properties of the light received by the spinel oxide semiconductor.

In one embodiment, the light absorption layer 30 absorbs light and transfers energy to the photoactive layer 28 using a non-radiative process. For example, the light absorption layer 30 may produce a hole-electron pair which transfers the energy, or the light energy may be absorbed and transferred by Förster resonance energy transfer (FRET), surface energy transfer (SET), Dexter energy transfer, or some other process.

In one embodiment, the top electrode 32 may absorb a photon and emit an electron through a photoelectric effect. The electron may then interact with the light absorption layer 30 or photoactive layer 28.

In one embodiment, light absorbed by the light absorption layer 30, the photoactive layer 28, or the inorganic substrate layer 26 may produce one or more free electron hole pairs in the material. The free electron and the hole may recombine, or may drift through the material and cross into different layers. Electrons or holes reaching the top electrode 32 and/or ohmic contact 24 may produce a measureable change in current.

According to a fourth aspect, the present disclosure relates to an electronic device comprising the photodiode of the first aspect. In a preferred embodiment, the photodiode may be used as a photodetector. A reverse bias voltage may be applied with a positive voltage at the ohmic contact 24 (cathode) and a negative voltage at the top electrode 32 (anode). Light transmitted to the photoactive layer 28 or other layers may be detected by an increased current flowing through the photodetector. Alternatively, without light illumination, the photodiode may be used as a rectifying diode, where current having a forward bias voltage may flow through the diode with less resistance than current having a reverse bias voltage.

In another embodiment, the photodiode may be used as a photovoltaic device, with the purpose of generating electric energy from irradiated light. In this embodiment, the photodiode may not have a reverse or forward bias applied to it, and may be designed with a slower response time and a larger exposed area than a photodiode designed as a photodetector.

In another embodiment, a photodetector array is envisioned including individually selectable anode lines and individually selectable cathode lines running perpendicular with the photoactive layer 28 described herein disposed between them. In this manner, each intersection of one of the anode lines and one of the cathode lines forms an individually selectable photodetector. These photodetectors offer applications in fiber optic communications, safety and security, process control, environmental sensing, astronomy, and defense.

In another embodiment, the photodiode described herein can have a rolled-up or spiral structure. In a related embodiment, one or more photodiodes may be incorporated into flexible electronic devices. Alternatively, a rolled-up or spiral structure is envisioned to function as an ionizing radiation detector with the ability to detect X-rays or gamma rays, or may function as a particle detector with the ability to detect neutrons and other subatomic particles. In another embodiment, one or more photodiodes may be incorporated into a touch-sensitive screen, in order to create a photosensitive device.

In another embodiment, the photodiode is envisioned to have applications in a number of different non-limiting circuits. In cameras this includes light meters, automatic shutter control, auto-focus, and photographic flash control. In medicine, this includes CAT scanners, X-ray detection, pulse oximeters, and blood particle analyzers. In communications, this includes fiber optic links, optical remote controls, and optical communications. In safety, this includes smoke detectors, flame monitors, intruder alert security systems, and security inspection systems. In industrial settings, this includes bar code scanners, light pens, brightness controls, encoders, positions sensors, surveying instruments, and copiers. In the automotive industry, this includes headlight dimmers, twilight detectors, and climate control-sunlight detectors.

The examples below are intended to further illustrate the photodiode and provide protocols for preparing and characterizing the photodiode, and uses thereof, and are not intended to limit the scope of the claims.

Example 1

Fabrication Process

In one embodiment of the invention, a high photoresponsivity isotype photodiode is provided. A diode based on an isotype junction was fabricated on a p-type spinel oxide semiconductor and a p-type conventional silicon wafer. The diode has the structure: Al/quantum dots/spinel oxide layer/p-Si/Al.

The isotype junction photodiode was fabricated on p-type silicon, the p-type silicon having a 400 µm thickness, a resistivity of 1-10 Ω·cm, and a (100) orientation. The p-type silicon substrate is doped to have a charge carrier concentration of $10^{15}$ to $10^{16}$ cm$^{-3}$. The p-type silicon substrate alone was cleaned by chemical baths, followed by ultrasonic treatment for 5 minutes.

Al metal was coated to a 100 nm thickness on the back side of the p-type silicon wafer by thermal evaporation or a sputtering method in a high vacuum chamber with a pressure of $10^{-5}$ Torr. Next, the Al-coated wafer was annealed at a eutectic temperature of 570° C. for 5 hours in nitrogen to obtain the ohmic contact.

The spinel oxide layer comprises a metal oxide with the formula $A^{2+}(B^{3+})_2(O^{2-})_4$, such as AFe$_2$O$_4$, where "A" is Zn, Cu, Co, and/or Mn. Each of these spinel oxides were synthesized and used in a photodiode. Each spinel oxide was deposited on the p-type silicon layer by a spin coating or drop casting method to a thickness of 50-100 nm. The spinel oxide layer semiconductor absorbs light in the spectral region of 350 nm to 700 nm. The absorption of the photoactive layer 28 may be tuned using a light absorption layer 30 comprising quantum dots, quantum rods, and/or quantum wires. The light absorption layer 30 used here is made of quantum dots such as cadmium sulfur (CdS), cadmium selenium (CdSe), cadmium telluride (CdTe), lead sulfide (PbS), lead selenium (PbSe), and lead telluride (PbTe).

The quantum dots were synthesized from precursor salts. For example, CdS quantum dots were prepared by mixing 0.5 M Cd(NO$_3$)$_2$ in ethanol (cadmium cationic precursor) with 0.5 M Na$_2$S in water (sulfur anionic precursor). CdSe and other quantum dots were prepared similarly with different precursor salts. To deposit the quantum dots, the spinel oxide films were dipped into this solution of quantum dots for 5 min, rinsed with ethanol, dried for 10 min, and allowed to cool to room temperature. This dipping procedure may be repeated three or more times to increase the quantum dot layer thickness. Then, the films were annealed at 300° C. for 10 min.

Finally, the top Al electrode was evaporated to a 100 nm thickness through a shadow mask with 1 mm diameter circles. The top electrode Al forms a Schottky contact with the spinel oxide layer. The photodiode has a contact area of $3.14 \times 10^{-2}$ cm$^2$, formed by a dot with a 2 mm diameter.

The electrical and photoresponse properties of the photodiodes in dark and under solar illumination from a 150 W solar simulator were measured using a Keithley 4200 semiconductor characterization system. The illumination intensity was changed using a variable power supply and optical meter. The photoconductive gain (photosensitivity) was measured as 6500-7000 at 7 V reverse bias under an illumination power density of 100 mW/cm$^2$ (FIG. 6).

The invention claimed is:
1. A photodiode, comprising:
an ohmic contact having a first work function;
an inorganic substrate layer in continuous contact with the ohmic contact;
a photoactive layer in continuous contact with the inorganic substrate layer;
a light absorption layer in continuous contact with the photoactive layer; and
a top electrode in contact with the light absorption layer, the top electrode having a second work function;
wherein the inorganic substrate layer comprises a semiconductor;
wherein the photoactive layer consists of ZnFe$_2$O$_4$ nanowires in N$_2$, the ZnFe$_2$O$_4$ nanowires present at 80-90 vol % relative to a total volume of the photoactive layer;
wherein the ZnFe$_2$O$_4$ nanowires have widths of 35-45 nm and lengths of 170-350 nm;
wherein all ZnFe$_2$O$_4$ nanowires are physically adsorbed to the inorganic substrate layer and to the light absorption layer;
wherein the inorganic substrate layer and the photoactive layer are both p-type semiconductors forming an isotype junction between each other;
wherein the light absorption layer comprises at least one material selected from the group consisting of quantum dots, quantum rods, and quantum wires; and
wherein the second work function is higher than the first work function.

2. The photodiode of claim 1, wherein the light absorption layer comprises quantum dots of at least one material selected from the group consisting of lead sulfide (PbS), lead selenide (PbSe), lead telluride (PbTe), cadmium selenide (CdSe), cadmium sulfide (CdS), and cadmium telluride (CdTe).

3. The photodiode of claim 1, wherein the spinel metal oxide has a direct optical band gap of 2.0-3.0 eV.

4. The photodiode of claim 1, wherein the semiconductor comprises at least one selected from the group consisting of silicon, germanium, indium gallium arsenide, lead (II) sulfide, indium phosphor, and mercury cadmium telluride.

5. The photodiode of claim 1, wherein an optical band gap of the photoactive layer is greater than an optical band gap of the light absorption layer.

6. The photodiode of claim 1, wherein the inorganic substrate layer has a thickness of 200-600 μm.

7. The photodiode of claim 1, wherein the photoactive layer has a thickness of 20-250 nm.

8. The photodiode of claim 1, wherein the light absorption layer has a thickness of 10-100 nm.

9. The photodiode of claim 1, wherein the top electrode is aluminum.

10. The photodiode of claim 1, wherein the inorganic substrate layer has a resistivity of 1-10 Ω·cm.

11. The photodiode of claim 1, which has a barrier height of 0.5-1.25 eV.

12. The photodiode of claim 1, which has a photoresponsivity of 0.10-0.40 A/W.

13. The photodiode of claim 1, which has a photosensitivity defined as the ratio of illuminated current to dark current of 6000-7500 at a bias of 5.0-8.0 V.

14. An electronic device comprising the photodiode of claim 1.

15. A method for forming the photodiode of claim 1, the method comprising:
- depositing the ohmic contact onto the inorganic substrate layer;
- spin or drop coating the $ZnFe_2O_4$ nanowires onto the inorganic substrate layer, thereby forming the photoactive layer;
- spin or drop coating at least one selected from the group consisting of quantum dots, quantum rods, and quantum wires onto the photoactive layer, thereby forming the light absorption layer;
- depositing the top electrode onto the light absorption layer.

16. A method of generating an electronic current, the method comprising:
- irradiating the photodiode of claim 1 with a light source which has a wavelength of 150-1500 nm.

* * * * *

UNITED STATES PATENT AND TRADEMARK OFFICE
CERTIFICATE OF CORRECTION

PATENT NO. : 10,770,605 B2
APPLICATION NO. : 15/492267
DATED : September 8, 2020
INVENTOR(S) : Wageh Swelm et al.

Page 1 of 1

It is certified that error appears in the above-identified patent and that said Letters Patent is hereby corrected as shown below:

On the Title Page

Item (72), the 2nd Inventor's address is incorrect. Item (72) should read:
-- (72) Inventors: Wageh Swelm, Jeddah (SA); Fahrettin Yakuphanoglu, Elazig (TR); Ahmed A. Al-Ghamdi, Jeddah (SA); Yusuf Abdulaziz Al-Turki, Jeddah (SA) --

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*